United States Patent
Carney et al.

(10) Patent No.: US 7,135,761 B2
(45) Date of Patent: Nov. 14, 2006

(54) ROBUST POWER SEMICONDUCTOR PACKAGE

(75) Inventors: Francis J. Carney, Gilbert, AZ (US); Jeffrey Pearse, Chandler, AZ (US); Stephen St. Germain, Scottsdale, AZ (US)

(73) Assignee: Semiconductor Components Industries, L.LC, Phoenix, AZ (US)

( * ) Notice: Subject to any disclaimer, the term of this patent is extended or adjusted under 35 U.S.C. 154(b) by 159 days.

(21) Appl. No.: 10/942,059

(22) Filed: Sep. 16, 2004

(65) Prior Publication Data

US 2006/0055011 A1    Mar. 16, 2006

(51) Int. Cl.
H01L 23/49    (2006.01)
H01L 23/48    (2006.01)
H01L 23/52    (2006.01)
H01L 21/44    (2006.01)
H01L 21/48    (2006.01)

(52) U.S. Cl. .............. 257/676; 257/692; 257/696; 438/111; 438/123

(58) Field of Classification Search ............ 257/676, 257/692, 696; 438/111, 123
See application file for complete search history.

(56) References Cited

U.S. PATENT DOCUMENTS

| | | | |
|---|---|---|---|
| 6,040,626 A | | 3/2000 | Cheah et al. |
| 6,319,755 B1* | | 11/2001 | Mauri ........................ 438/119 |
| 6,396,127 B1* | | 5/2002 | Munoz et al. ............... 257/666 |
| 6,528,880 B1* | | 3/2003 | Planey ........................ 257/735 |
| 6,717,260 B1 | | 4/2004 | Pavier et al. |
| 6,924,175 B1* | | 8/2005 | Pavier et al. ............... 438/123 |
| 2004/0080028 A1 | | 4/2004 | Yanagisawa |
| 2004/0104489 A1 | | 6/2004 | Larking |
| 2005/0269694 A1* | | 12/2005 | Luechinger ................. 257/724 |

OTHER PUBLICATIONS

"Automated Ribbon Bonding for Microwave and MCM Applications", by Bradley K. Benton, Palomar Technologies, Inc., at Resources, Ribbon White Papers, website http://www.palomartechnologies.com/resources/whitepapers/auto_ribbon.htm.
"Tech Forum: Wire Bonding Optoelectronics Packages", By Iee R. Levine, Chip Scale Review, Nov.-Dec. 2001 (see website: http://www.chipscalereview.com/archives/ES/issues/1101/techForum_01.html).

* cited by examiner

*Primary Examiner*—Long Pham
*Assistant Examiner*—Shrinivas H. Rao
(74) *Attorney, Agent, or Firm*—Kevin B. Jackson

(57) ABSTRACT

A power semiconductor package, including a leadframe having at least one first terminal, a second terminal and a third terminal. The package also includes a semiconductor power die having a bottom surface defining a first current carrying electrode and a top surface on which a first metalized region defining a second current carrying electrode and a second metalized region defining a control electrode are disposed, the bottom surface being coupled to the leadframe such that the first terminal is electrically connected to the first current carrying electrode. A clip is also coupled to the first metalized region defining the second current carrying electrode and to the second terminal such that it is electrically coupled to the second current carrying electrode.

26 Claims, 2 Drawing Sheets

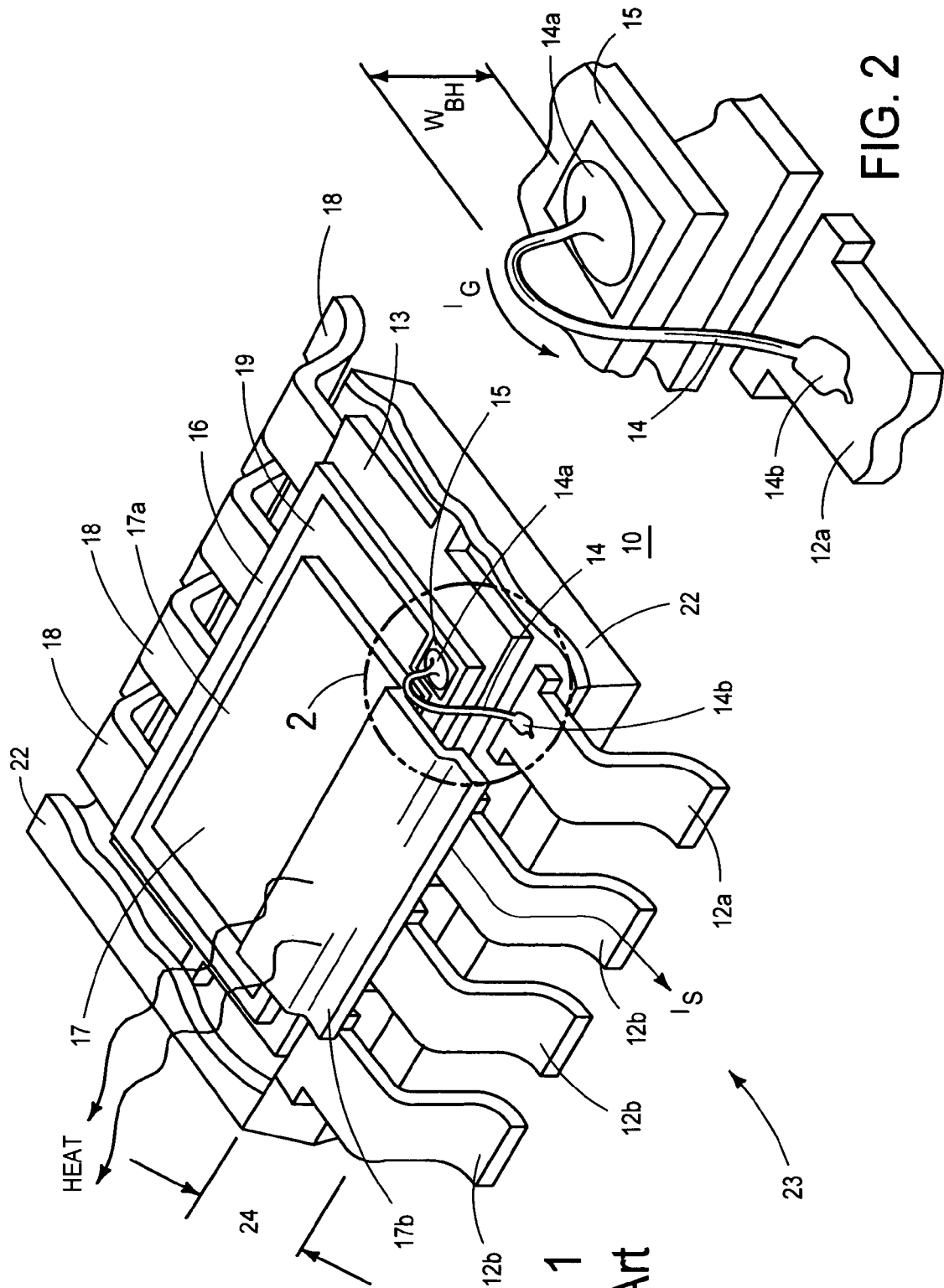

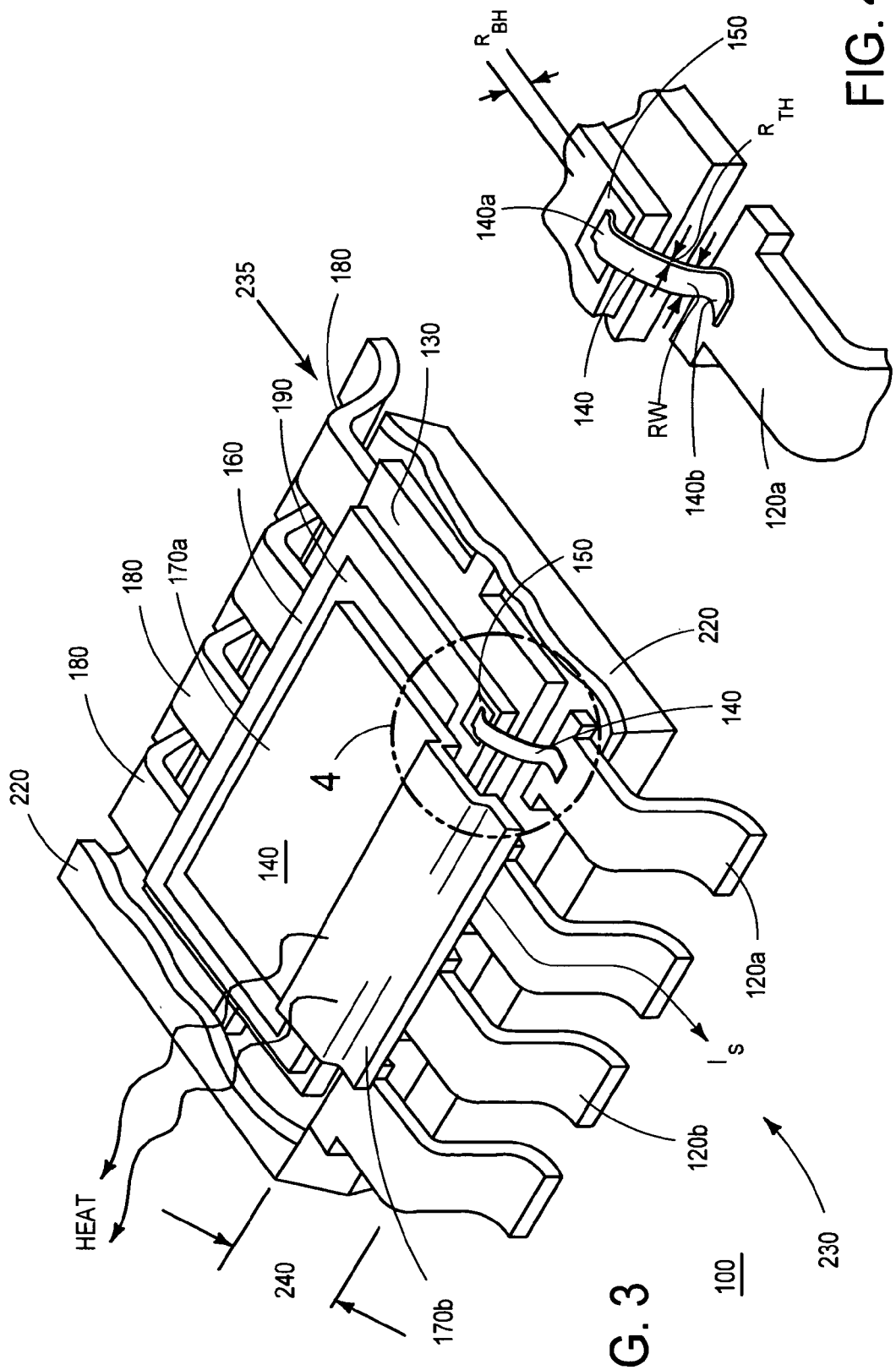

ROBUST POWER SEMICONDUCTOR PACKAGE

BACKGROUND OF THE INVENTION

The present invention relates in general to a power semiconductor package, and more particularly, to a power semiconductor package (e.g., SO8 or QFN) in which a power semiconductor die current carrying electrode is electrically coupled to a leadframe via a clip while the power semiconductor die control electrode is electrically coupled to the leadframe via a ribbon bond.

With reference to FIG. 1 and FIG. 2, a semiconductor package 10 according to the prior art is shown as presented in U.S. Pat. No. 6,040,626. The semiconductor package 10 includes a bottom plate portion 13 and terminals 12a, 12b and 18. A semiconductor die 16 includes a first metalized region 19 (typically aluminum) defining a first connection area for a top surface of the semiconductor die 16, and a second metalized region 15 (typically aluminum) defining a second connection area for the top surface of the semiconductor die 16. Portions of the terminals 12a, 12b, 18, bottom plate 13, and semiconductor die 16 are encapsulated in a housing 22, typically formed from a moldable material.

In order to obtain an electrical connection between the first metalized region 19 and the terminal(s) 12b, a clip 17 is attached at one end 17a to the first metalized region 19 and at a distal end 17b to the terminal(s) 12b. Clip 17 is typically made from fairly rigid copper and optionally silver plated for either solder attachment or conductive epoxy attachment. The electrical connection between the second metalized region 15 and the terminal 12a is obtained by ultrasonically attaching a wirebond bond 14 by end 14a to second metalized region 15 and wirebond 14 end 14b to terminal 12a.

It is desirable to significantly reduce the resistance and the inductance of current paths through a power semiconductor package in order to ensure optimum electrical performance of the semiconductor device, as well as to minimize or reduce the overall footprint 23 and thickness 24 of semiconductor package 10 to improve heat removal to allow for increased power operation. Unfortunately, the semiconductor packages of the prior art do not fully achieve these objectives because, among other things, the area of the metalized region or gate contact 15 must be sufficiently large to accommodate wirebond 14 attachment, which in turn detrimentally reduces the area of the metalized region or source contact 19 as will be shown below.

As well known in the art, attachment of wirebond 14 typically includes forming a wirebond ball on wirebond 14 end 14a for attachment to gate contact 15 and a wirebond stitch on wirebond 14 end 14b for attachment to terminal 12a. In general, the dimensions of gate contact 15 which determine its area are typically selected to be approximately five times the diameter of wirebond 14, as the wirebond ball is approximately three times the diameter of wirebond 14. As the diameter of wirebond 14 becomes smaller, for example in the range below one hundred twenty five micrometers ("microns") the wirebond becomes frail, difficult to form or handle, requires more expensive manufacturing equipment and is subject to shock and mechanical stresses, which increases undesirable failure of the electrical connection and thus the device. Even at what is currently considered as the practical low cost wirebond diameter limit wherein diameters such as fifty microns are employed (smaller than this is considered impractical due to at least the above frailty, reliability and cost concerns), a significantly large gate metal contact 15 area is still required of about sixty two thousand five hundred square microns in area (five times fifty microns by five times fifty microns). Thus, the area available for metalized region or source metal contact 19 on a die of about five thousand microns by five thousand microns would be about seventeen million and sixty two thousand five hundred square microns (allowing about five hundred microns for streets, such as between metal contacts and the edge of the die) or about sixty eight percent of the available die area. Thus, as die area or size is expected to become smaller while the size of the wire bond gate contact is for practical purposes fixed in size at about sixty two thousand five hundred square microns or larger, the source metal area will decrease correspondingly.

Large clip 17 is used to enable high power operation such as generated by large source current $I_S$, as well as to improve heat removal. Furthermore, large clip 17 desirably decreases resistance and inductance. Large clip 17 requires a large metal area to make appropriate connection. Therefore, as the source metal area is the largest source of thermal radiation or heat needing to be removed from the die, finding ways to maximize the source metal area for a given die size is an imperative for increasing power ratings while producing smaller packaged semiconductor devices.

Additionally, even when employing small wirebond 14 diameters such as fifty microns, the thickness 24 of semiconductor package 24 must be sufficiently thick in order to allow for the height $W_{BH}$ of wirebond 14 to be covered by mold compound 22. Unfortunately, wirebond height $W_{BH}$ presents a constraint on decreasing thickness 24 of the packaged semiconductor device to additionally improve removal of heat from the die by having minimal mold compound over the die.

Fundamentally, the area or footprint 23 required to mount the power semiconductor package is also determined in part by the area of the metalized region or source metal contact 19 and metalized region or gate metal contact 15, as the smaller the die the smaller the footprint. As above, the area of gate metal contact 15 is fairly fixed, thus further die size reductions will come at the detrimental expense of reducing the area of source metal contact 19 so important to electrical and thermal performance, thus power rating.

Thus, problems associated with decreased source metal area will become further exacerbated as future requirements for smaller and smaller die having increased power and thermal operating requirements.

Hence, there is a need for a power semiconductor device and package having a small footprint, high current and thermal dissipation capability and a high reliability while maintaining a low manufacturing cost.

BRIEF DESCRIPTION OF THE DRAWINGS

FIG. 1 shows a perspective view of a semiconductor package according to the prior art;

FIG. 2 shows a detail perspective view of the semiconductor package of FIG. 1;

FIG. 3 is a perspective view of a new power semiconductor package; and

FIG. 4 is a detail perspective view of the new power semiconductor package of FIG. 3.

DETAILED DESCRIPTION OF THE DRAWINGS

In the figures, elements having the same reference number have similar functionality.

FIG. 3 and FIG. 4 show a new power semiconductor package 100. Package 100 is shown in an SO8 configuration. In an alternate embodiment (not shown) package 100 can be easily configured by one of average skill in the art as a QFN package. The semiconductor package or device 100 includes a leadframe having a bottom plate portion 130 and terminals 120a, 120b and 180. In one embodiment, at least one of either terminal 120a or 120b are formed co-planar with terminal 180. A semiconductor die 160 includes a first metalized region or current carrying electrode 190 (typically solderable top metal, aluminum or the like) defining a first connection area for a top surface of the semiconductor die 160, and a second metalized region or control electrode 150 (typically solderable top metal, aluminum or the like) defining a second connection area for the top surface of the semiconductor die 160. Semiconductor die 160 includes a third metalized region or current carrying electrode (typically backside metal or the like) defining a third connection area or drain on a bottom surface of the semiconductor die 160. Power semiconductor die or devices 160 include field effect transistor(s) (FET), metal oxide semiconductor field effect transistor(s) (MOSFET), insulated gate bipolar transistor(s) (IGBT), bipolar junction transistor(s) (BJT) and thyristors(s). The third metalized region is electrically coupled to the bottom plate portion 130 and to terminals 180. Bottom plate portion 130, terminals 180, 120a and 120b are included in and often referred to as leadframe 235.

In one embodiment, semiconductor die is coupled to bottom plate portion 130 electrically and mechanically by soldering. In one embodiment, semiconductor die 160 is formed to about five thousand microns by five thousand microns, first metalized region or source 190 is formed having an area of about seventeen million two hundred and twenty million square microns, and second metalized region 150 or gate is formed having an area of about sixteen thousand eight hundred and seventy five square microns (allowing about five hundred microns for streets as prior). Portions of the terminals 120a, 120b, 180, bottom plate 130, and semiconductor die 160 are encapsulated in a housing 220, typically formed from a moldable material (such as plastic). In order to obtain an electrical connection between the first metalized region 190 and the terminal(s) 120b, a clip 170 is attached at one end 170a to the first metalized region 190 and at a distal end 170b to the terminal(s) 120b. Clip 170 is typically a rigid piece made from copper and optionally silver plated. Clip 170 is placed using pick and place equipment. In one embodiment, clip 170 is formed having a thickness of about one hundred twenty five microns and a width of about twenty five hundred microns and is mechanically and electrically coupled by soldering the clip 170 to the first metalized region and terminal(s) 120b, or alternatively with a layer of curable conductive material disposed between the clip and the first metalized region.

The electrical connection between the second metalized region 150 and the terminal 120a is obtained by ultrasonically attaching a ribbon bond 140 by end 140a to second metalized region 150 and ribbon bond 140 end 140b to terminal 120a.

Ribbon bond 140 refers to a flexible rectangular shaped conductor, wherein a width $R_W$ of ribbon bond 140 is greater than a thickness $R_{TH}$ of the ribbon bond. When viewed from the side, the flexible nature of ribbon bond 140 may be evidenced by an undulating profile, although on shorter spans or assembly conditions this characteristic may not be readily apparent to the eye. Ribbon bond 140 materials include gold, aluminum, silver, palladium and copper. In one embodiment, ribbon bond 140 is formed having a thickness of about twenty five microns and a width of about seventy five microns. Ribbon bond 140 material is typically formed to a thickness of about six microns to fifty microns and a width of about fifty microns to fifteen hundred microns wide. Unlike wirebond 14, as ribbon bond 140 becomes smaller, for example in the range below about seventy five microns wide by twenty five microns thick, ribbon bond 140 retains superior mechanical strength, has lower loop height $W_{BH}$, is easier to form and handle, and is less susceptible to shock and mechanical stress than an equivalent area wirebond 14, therefore reducing undesirable and expensive failure of the electrical connection and thus the device.

Attachment of ribbon bond 140 typically includes wedge bonding end 140a to gate contact 150 and wedge bonding end 14b to terminal 120a. In general, an area of gate contact 150 is typically selected to be approximately three times the width by three times the thickness of ribbon bond 140, as unlike requirements for wirebond area, ribbon bond area can be smaller without sacrificing manufacturability, reliability or strength. Therefore, ribbon bond 140 reduces the size of gate metal contact 150 required.

For example, in the embodiment where a fifty micron wirebond is replaced with a equivalent cross sectional area ribbon bond of twenty five microns thick $R_{TH}$ by seventy five microns wide RW, a gate pad area of about sixteen thousand eight hundred and seventy five square microns is required, or about a seventy five percent smaller gate pad than that required by the equivalent cross sectional area wirebond. Thus, by the above reduction in gate pad size, the source metal area can be correspondingly increased (e.g., by about one hundred fifty eight thousand square microns) without increasing die size, and therefore without requiring an increased power integrated circuit package footprint 230.

Providing larger source metal contact 190 enables higher power operation of power integrated circuit package 100 as well as improves heat removal. Furthermore, larger clip 170 also desirably decreases resistance and inductance.

Additionally, ribbon bond 140 reduces the loop height $W_{BH}$ by at least a factor of three over wire bond 14 loop height $R_{BH}$, thus enabling the thickness 240 of package 100 to be significantly less than that of package 10. In one embodiment, ribbon bond 140 is formed having a loop height of about fifty microns.

Moreover, as the area or footprint 230 required to mount the power semiconductor package is determined in part by the areas of the metalized region or source metal contact 190 and metalized region or gate metal contact 150, the power semiconductor package 100 can be smaller without sacrificing performance than a wire bonded gate/source clip version of the prior art.

The foregoing description of the present invention has been provided for the purposes of illustration and description. It is not intended to be exhaustive or to limit the invention to the precise forms disclosed. Many modifications and variations are possible in light of the above teaching. It is intended that the scope of the invention be limited not by this detailed description, but rather by the claims appended hereto. Hence, there has been shown a new power semiconductor device and package having a small footprint, high current and thermal dissipation capability and a high reliability while maintaining a low manufacturing cost.

What is claimed is:

1. A power semiconductor package, comprising:
   a leadframe having a bottom plate portion and at least one first terminal extending from the bottom plate portion;
   at least one second terminal being co-planar with the first terminal;
   a third terminal;

a power semiconductor die having a bottom surface defining a first current carrying electrode and a top surface on which a first metalized region defining a second current carrying electrode and a second metalized region defining a control electrode are disposed, the bottom surface being coupled to the bottom plate of the leadframe such that the first terminal is electrically connected to the first current carrying electrode;

a clip coupled to the first metalized region defining the second current carrying electrode and to the at least one second terminal such that it is electrically coupled to the second current carrying electrode; and a ribbon bond coupling the control electrode to a third terminal, wherein the ribbon bond comprises a rectangular shaped conductor having a width greater than its thickness, and wherein the control electrode has an area less than or equal to approximately three times the width by three times the thickness.

2. The power semiconductor package of claim 1, further comprising a layer of solder disposed between the clip and the first metalized region such that the clip is firmly coupled to the second current carrying electrode.

3. The power semiconductor package of claim 1, wherein the clip includes a top surface and a bottom surface, the bottom surface having downwardly directed projections extending towards the leadframe.

4. The power semiconductor package of claim 3, further comprising a layer of curable conductive material disposed between the clip and the second current carrying electrode.

5. The power semiconductor package of claim 4, wherein the curable conductive material is silver filled epoxy.

6. The power semiconductor package of claim 1, further comprising a layer of solder disposed between a distal end of the clip and the at least one second terminal.

7. The power semiconductor package of claim 1, wherein the power semiconductor die includes a MOSFET power semiconductor die, and wherein the second current carrying electrode comprises a source region.

8. The power semiconductor package of claim 1, wherein the ribbon bond is formed having a width of less than seventy five micrometers.

9. The power semiconductor package of claim 1, wherein the ribbon bond is formed having a thickness of less than twenty five micrometers.

10. The power semiconductor package of claim 1 wherein the ribbon bond is formed of a metal selected from the group consisting of gold, copper, silver, palladium and aluminum.

11. The power semiconductor package of claim 1, wherein one end of the ribbon bond is wedge bonded to either the control electrode or the third terminal.

12. The power semiconductor package of claim 1, wherein the package includes a plastic housing which substantially encapsulates the bottom leadframe, semiconductor die and clip.

13. A power semiconductor package, comprising:
a leadframe having a bottom plate portion and at least one first terminal extending from the bottom plate portion;
at least one second terminal being co-planar with the first terminal;
a MOSFET die having a top surface on which a first metalized region defining a source and a second metalized region defining a gate are disposed, the MOSFET die further including a bottom surface defining a drain connection coupled to the bottom plate of the leadframe such that the first terminal is electrically connected to the drain;
a clip coupled to the first metalized region defining the source connection and to the at least one second lead such that it is electrically coupled to the source; and a ribbon bond coupling the gate to a third terminal, wherein the ribbon bond comprises a rectangular shaped conductor having a width greater than its thickness, and wherein the second metalized region has an area less than or equal to approximately three times the width by three times the thickness.

14. The power semiconductor package of claim 13, wherein the clip is coupled by a layer of solder.

15. A power semiconductor device comprising: a lead frame having a bottom plate portion and at least one first lead extending from the bottom plate portion; at least one second lead being co-planar with the first terminal; a third lead; a power semiconductor die having a bottom surface defining a first current carrying electrode connection and a top surface on which a first metalized region defining a second current carrying electrode and a second metalized region defining a control electrode are disposed the bottom surface being coupled to the bottom plate of the lead frame such that the first lead is electrically connected to the first current carrying electrode; a clip coupled to the first metalized region defining the second current carrying electrode and to the at least one second lead such that it is electrically coupled to the second current conduction electrode and a ribbon bond coupling the control electrode to the third lead, wherein the ribbon bond comprises a flexible rectangular conductor having a width greater than its thickness and wherein the control electrode has an area less than or equal to approximately three times the width by three times the thickness.

16. The power semiconductor device of claim 15, wherein the clip includes a top surface and a bottom surface, the bottom surface having downwardly directed projections extending towards the leadframe.

17. The power semiconductor device of claim 15, further comprising a layer of curable conductive material disposed between the clip and the second current carrying electrode.

18. The power semiconductor device of claim 17, wherein the curable conductive material is silver filled epoxy.

19. The power semiconductor device of claim 15, further comprising a layer of solder disposed between the clip and the first metalized region such that the clip is firmly coupled to the second current carrying electrode.

20. The power semiconductor device of claim 16, wherein the ribbon bond is formed having a width of less than seventy five micrometers.

21. The power semiconductor device of claim 16, wherein the ribbon bond is formed having a thickness of less than twenty five micrometers.

22. The power semiconductor device of claim 16 wherein the ribbon bond is formed of a metal selected from the group consisting of gold, copper, palladium, silver and aluminum.

23. The power semiconductor device of claim 15, wherein the power semiconductor die includes a MOSFET power semiconductor die.

24. The power semiconductor device of claim 16, wherein the package is sized and shaped to conform to a SO8 package configuration.

25. The power semiconductor device of claim 16, wherein the ribbon bond is wedge bonded at one end to the control electrode and wedge bonded at another end to the third lead.

26. The power semiconductor device of claim 19, wherein the second metalized region has an area of less than about seventeen thousand square micrometers.

* * * * *